United States Patent [19]

Olsson et al.

[11] Patent Number: 4,571,576

[45] Date of Patent: Feb. 18, 1986

[54] HIGH SPEED ANALOG-TO-DIGITAL CONVERTER

[75] Inventors: Nils A. Olsson; Chandra K. N. Patel, both of Summit, N.J.

[73] Assignee: AT&T Bell Laboratories, Murray Hill, N.J.

[21] Appl. No.: 546,991

[22] Filed: Oct. 31, 1983

[51] Int. Cl.⁴ .................................... H03K 13/02
[52] U.S. Cl. .................... 340/347 AD; 372/28; 332/7.51
[58] Field of Search ............ 340/347 AD; 356/96.14, 356/300, 328, 329; 350/DIG. 2, 355; 372/20, 26, 28, 108; 455/609, 611; 364/713; 332/7.51

[56] References Cited

U.S. PATENT DOCUMENTS

| | | | |
|---|---|---|---|
| 3,500,233 | 3/1970 | Doyle | 372/28 |
| 3,503,670 | 3/1970 | Kosanke | 350/DIG. 2 |
| 3,815,045 | 6/1974 | Ito | 372/108 |
| 4,191,473 | 3/1980 | Hansch | 356/300 |

OTHER PUBLICATIONS

H. Taub, et al., *Digital Integrated Electronics*, "14. Analog-To-Digital Conversions," McGraw-Hill, 1977, pp. 486-543.

S. Wright, et al., "High-Speed Electro-Optic Analogue-Digital Conversion," *Electronics Letters*, vol. 10, No. 24, Nov. 28, 1974, pp. 508-509.

H. F. Taylor, "An Electrooptic Analog-To-Digital Converter," *Proceedings of the IEEE*, Oct. 1975, pp. 1524-1525.

*Primary Examiner*—Charles D. Miller
*Attorney, Agent, or Firm*—Richard D. Laumann

[57] ABSTRACT

An analog-to-digital converter using a frequency tunable laser having output radiation of a frequency determined by the input voltage to the laser is described.

11 Claims, 3 Drawing Figures

HIGH SPEED ANALOG-TO-DIGITAL CONVERTER

TECHNICAL FIELD

This invention relates generally to the field of analog-to-digital converters, and particularly to such converters which use frequency tunable lasers.

BACKGROUND OF THE INVENTION

Devices which convert analog signals to digital signals are commonly referred to as A/D converters and are of great importance in modern technology. For example, in many applications, a signal, which may represent voltage, current, pressure, etc., is generated in analog form but further processing of the signal is desired. The additional processing is frequently more expeditiously performed if the analog signal is converted to a digital form so that the entire processing may be done digitally.

The A/D conversion is performed as the A/D converter samples the analog signal and then quantizes it to obtain a digital representation of the original analog signal. The subject of analog-to-digital converters is discussed generally by Taub and Schilling in *Digital Integrated Electronics*, pp. 486–543, McGraw-Hill, 1977. Although much of their discussion is applicable to A/D converters generally, the specific embodiments of A/D converters discussed by these authors are converters that perform the analog-to-digital conversion electronically. It will be readily appreciated by those skilled in the art that the accuracy of the analog-to-digital conversion depends upon the frequency at which the analog signal is sampled and quantized. This is true because the sampling frequency sets a limit to the highest frequency component of the analog signal which may be accurately determined. As a result, there is an interest in high speed A/D converters and, in particular, A/D converters that might be faster than electronic A/D converters.

One such A/D converter is the electrooptic converter, such as that discussed in *Electronics Letters*, 10, pp. 508–509, Nov. 28, 1974 which used a LiNbO3 diffraction modulator. Analog voltages are applied to the modulator and an array of photodiodes so that individual photodetectors detect particular orders of the diffraction pattern. A digital code is then generated by applying the voltages from the photodiodes to threshold detectors. Another electrooptic converter is discussed in *Proceedings of the IEEE*, pp. 1524–1525, Oct. 1975. The converter described was a three-bit electrooptic converter comprising a plurality of electrooptic waveguide modulators having electrodes of different lengths. Polarized cw light is incident on each waveguide and a signal voltage is applied to each waveguide. The phase of the TE mode is retraded with respect to the TM mode by an amount that depends on the voltage and the electrode length. The intensities of the two orthogonally polarized components of the light from each waveguide are detected separately, and the relative intensities of these components determine whether the value of the bit is 0 or 1, i.e., each waveguide determines one bit. Another electrooptic analog-ditital converter is described in *IEEE Journal of Ouantum Electronics*, Vol. QE-18, pp. 1411–1413, Oct. 1982. This converter used a AlGaAs diode laser as the light source for the short optical pulses used for sampling and a LiNbO3 Ti indiffused interferometric waveguide array for analog-to-ditital conversion.

SUMMARY OF THE INVENTION

We have found that a frequency tunable laser is useful for fabricating a high speed A/D converter. The converter comprises a laser, said laser having at least one electrode for receiving an input voltage and emitting radiation at a frequency determined by said input voltage to aid laser; an array of photodetectors; and wavelength dispersive means for directing said radiation from said laser to said array of photodetectors. The wavelength dispersive means comprises, in one embodiment, a curved grating and directs radiation of particular wavelengths from the laser to particular photodetectors within the array. That is, each photodetector receives and detects radiation of one wavelength. Signal outputs from the photodetectors represent the digitized signal. In one preferred embodiment, the laser comprises a cleaved coupled cavity laser. In another embodiment, the resolution of the converter is further increased by the addition of a voltage divider and a second laser.

For reasons of clarity, the elements of the devices are not drawn to scale.

DETAILED DESCRIPTION

Figure 1:
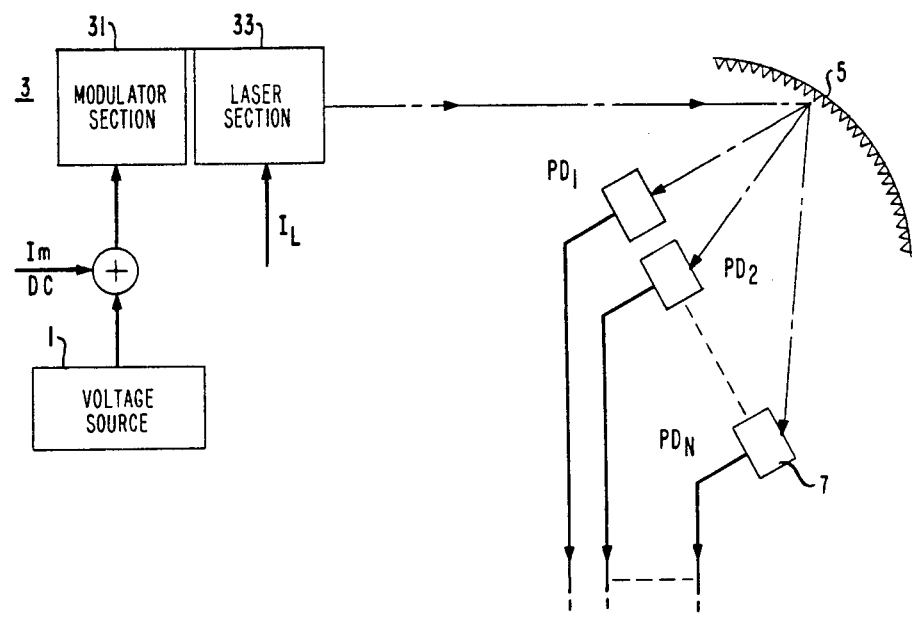
FIG. 1 is a schematic representation of an A/D converter according to our invention.

A schematic representation of an A/D converter according to our invention is depicted in FIG. 1. The device comprises an input voltage source 1, a frequency tunable laser, i.e., a laser whose output wavelength or frequency is a function of the input voltage or current, indicated generally as 3, wavelength dispersive means 5, and an array of photodetectors 7. The input voltage source is an analog which is to be digitized. In the embodiment depicted, the wavelength dispersive means comprises a curved grating which directs different wavelengths of the output radiation from the tunable laser 3 to specific photodetectors, $PD_1, PD_2, \ldots, PD_N$, within array 7. In the embodiment depicted, the photodetectors comprise a linear array of photodetectors with each element of the array, that is, each photodetector, receiving and detecting radiation of a different wavelength as depicted. The laser is a frequency tunable semiconductor laser such as a cleaved coupled cavity laser.

The grating disperses each wavelength into a separate photodetector within the array and the resulting output from the array is available in digitized form. If section 33 is excited by a pulsed current source, the A/D converter is strobed at the pulse rate. If section 33 is cw excited, the A/D converter continuously samples the input. The laser thus acts as a level discriminator of the analog input signal and the digitized output is coded in terms of the optical wavelength. It will be appreciated that the optical output may be transmitted over optical fibers of processing at remote locations. It should also be noted that a wideband continuously tunable laser, such as a PbSnTe laser operating in the infrared region, having output radiation of a wavelength determined by the drive current, might also be used. The particular type of photodetector used in the array is not critical. However, as will be readily appreciated by those skilled in the art, the photodetectors must be sensitive to the wavelengths of the laser and have a response time less than the digitizing rate.

A coupled cavity laser, such as the cleaved coupled cavity laser described in *Applied Physics Letters*, 42, pp. 650–652, Apr. 15, 1983, may be used as the tunable light source. The coupled cavity laser comprises a first or modulator section 31 and a second or laser section 33. Each section further comprises an active layer which is the region where electron hole recombination occurs. A current, $I_L$, goes through the second section and a dc current, $I_M$, as well as the analog input current 1 goes through the modulator section. The cavities are mutually optically coupled to each other through cleaved semiconductor surfaces, i.e., mirrors, and the active stripes are aligned with respect to each other, i.e., the stripes are positioned essentially colinearly with respect to each other, and separated by a relatively small distance, typically less than 10 $\mu$m, but greater than the carrier tunneling distance, thus providing electrical isolation between the sections. This, i.e., the carrier tunneling distance, is approximately 200 Angstroms for electrons in InGaAsP.

The sections should be electrically isolated from each other, i.e., they should be capable of being separately electrically biased relative to each other. This permits the carrier concentrations, the injection currents, and hence in the two sections to be separately controllable.

The composition of the semiconductor layers and substrate comprising the laser is not critical, although the layers and substrate should be at least approximately lattice matched to each other or form a strained layer superlattice, and may be selected from Group III–V and Group II–VI compound semiconductors. These compositions, for example, InGaAsP, permit the wavelength of the emitted radiation to be in those areas, 1.35 and 1.55 $\mu$m, presently of greatest interest for optical communciations.

An exemplary method for forming devices comprising coupled cavities from a unitary structure according to this invention will be briefly described. A standard semiconductor laser wafer had, on one surface, a plurality of gold pads which are formed by, for example, electroplating. The precise structures of the active stripes and adjacent layers are not critical and they may be buried heterostructures, buried crescent heterostructures, or yet other types. The desired layers may be grown on the substrate by growth techniques, such as molecular beam or liquid phase epitaxy or yet another technique, that are well known to those skilled in the art. However, the isolated thick gold pads should preferably be approximately the same size as the standard laser diode and are electroplated onto the wafer side having the epitaxial layers, if the diode is cw bonded epitaxial layer (epilayer) side down, or onto the substrate side, if the diode is bonded epilayer side up. Other deposition techniques, such as evaporation, may also be used. Metals other than gold may be used if they adhere to the semiconductor and may be plastically deformed. Standard and well-known cleaving procedures are now applied. At one position, the bars separate from each other as these positions are not contacted by the gold pads. However, at the other positions, the presence of the gold pad holds the adjacents cleaved bars together. The lengths are not critical and can be selected as desired. The individual pairs of diodes, which are still held together by the gold pads, are now separated from each other by sawing or scribing. The resulting structure of a single pair of laser diode sections has two precisely self-aligned and extremely closely optically coupled Fabry-Perot cavities. The mirrors of the cavities are formed by the cleaved semiconductor surfaces.

A typical separation of the coupled cavities is approximately 1 $\mu$m. If a larger separation is desired, it can be easily obtained by, for example, moving the two Fabry-Perot diodes with respect to each other using the gold pad as the hinge. The precise separation is not critical but it should be greater than the carrier tunneling distance through vacuum and less than approximately 10 $\mu$m. Of course, the last movement should place the mirror faces parallel or approximately parallel to each other so that the active stripes are aligned with respect to each other. The mirror faces need not be precisely parallel to each other as the angular distribution of the emitted radiation is sufficiently broad to optically couple the two cavities. However, the faces should not contact each other, as electrical isolation between the sections is desired. Further, the Fabry-Perot diodes may be slightly twisted with respect to each other with the active stripes forming the twist axis. This twist has a transverse mode filtering effect, i.e., certain transverse modes can be suppressed.

To complete the fabrication of the device, the two Fabry-Perot diodes hinged together by the gold pad are bonded, using, e.g., indium, simultaneously epilayer side down on a heat sink, such as gold plated copper if the gold pad is on the epilayer side. Standard cw bonding procedures may be employed. Separate electrical connections are made to each diode on the substrate side. Of course, if the gold pads are on the substrate side, the Fabry-Perot diodes are bonded simultaneously substrate side down, respectively, and the separate electrical connections are made on the epilayer side.

Use of the gold bonding pads is not essential. For example, the laser diode sections may be formed by cleaving a standard wafer without bonding pads and then positioning the diodes with respect to each other on the heat sink and bonding. However, the use of the gold pads facilitates relatively accurate positioning of the active stripes with respect to each other.

The output frequency of the coupled cavity laser is a step function of the etalon section current. Thus, as the input voltage and, therefore, the input current, changes, the laser frequency, and therefore the wavelength of the output radiation, changes. The output radiation passes through the wavelength dispersive means and is directed to the different individual detector elements of the photodetector array, thus giving rise to signal outputs, indicated by the solid lines in FIG. 1, from the photodetectors that receive the specific frequency laser output. The signal outputs represent the digitized signal.

Figure 2:
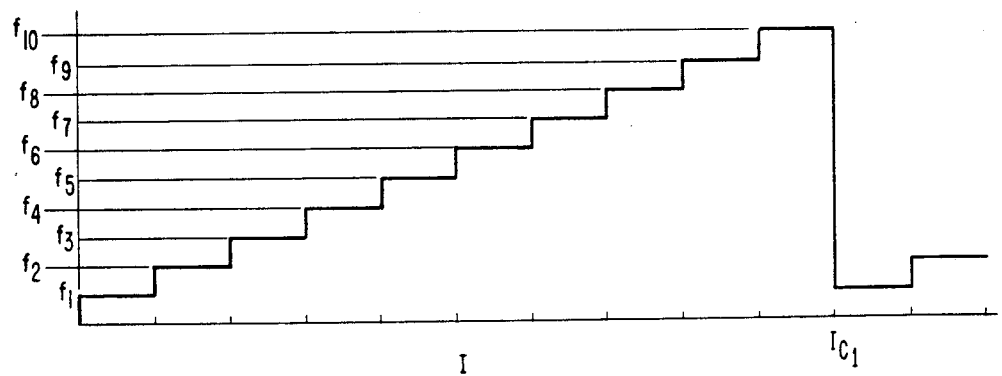
FIG. 2 plots frequency vertically versus current horizontally for an A/D converter using a cleaved coupled cavity laser.

The laser is operated as follows in our A/D converter. One section 33 is biased above threshold. Frequency tuning is obtained by varying the current through the second section 31 of the coupled cavity system. The output frequency of the coupled cavity system jumps discretely from one mode to another as the resonance of one cavity is changed by varying the refractive index as the carrier density varies, i.e., the second cavity may be though of as a frequency selective etalon. It should be noted that the laser output varies from one discrete frequency to another with the freuency separation being determined by the mode spacings of the cavities. The output frequcney as a function of current is represented in FIG. 2. The current is plotted horizontally and the output frequencies, $f_1, f_2, \ldots, f_{10}$, are plotted vertically. It should be noted that as the current is increased, the laser output wavelength varies monotonically and changes from one discrete mode, i.e., frequency or wavelength, to the next discrete mode until a frequency is reached, $f_{10}$, at which the output wavelength jumps back to the initial frequency, $f_1$, and again increases, etc. The current at which this occurs is indicted at $I_{c1}$.

Figure 3:
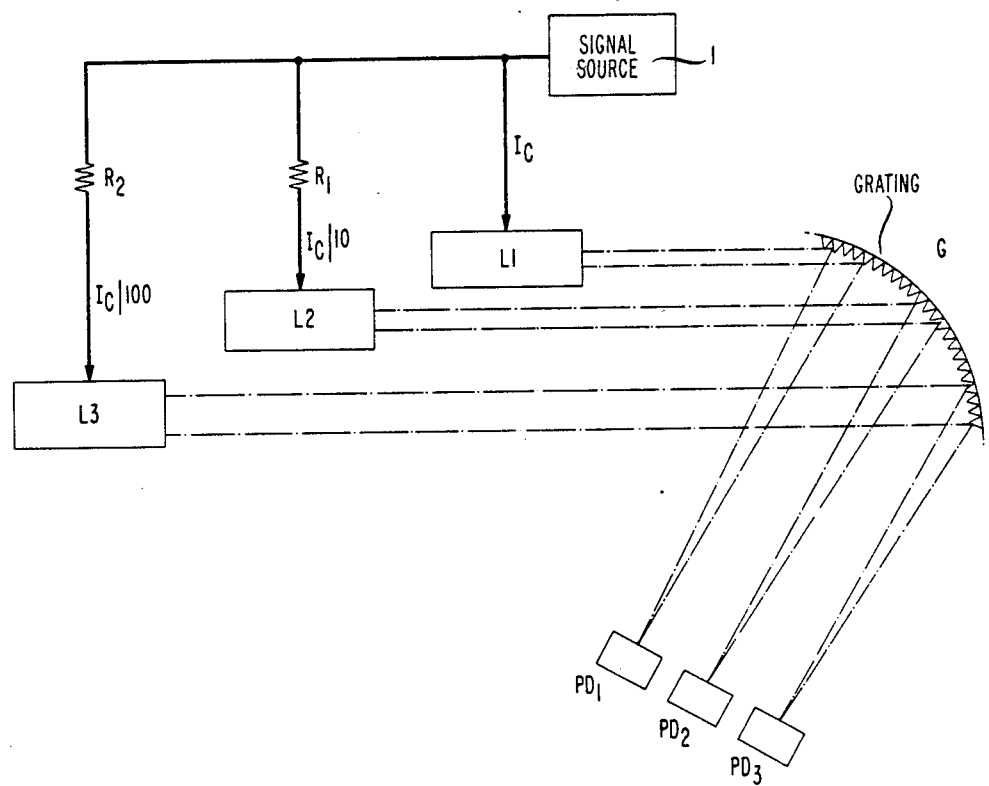
FIG. 3 is a schematic representation of another embodiment of an A/D converter according to our invention.

The resolution can be increased by an additional order of magnitude by addng a second laser to the A/D converter. One such embodiment is shown schematically in FIG. 3. The embodiment comprises three frequency tunable lasers, $L_1$, $L_2$, and $L_3$, three photodetector arrays, $PD_1$, $PD_2$, and $PD_3$, as well as the wavelength dispersive means. There is also an analog signal source 1 and resistances $R_1$ and $R_2$ connected to lasers $L_2$ and $L_3$, respectively. Again, the radiation from the lasers is directed to the photodetector arrays by the wavelength dispersive means such as the curved grating depicted. The input voltage to the laser passes through a voltage divider so that current to $L_1$ is $I_c$, to $L_2$ is $I_c/10$, and to $L_3$ is $I_c/100$, etc. Thus, each laser increases the A/D dyamic range by a factor of 10.

The precision of the A/D converter can be also increased by increasing the tuning range and thus, the number of modes, of the coupled cavity laser. However, there is a tradeoff between speed and the number of digitized levels. The modulator section of the laser is operated below threshold and the switching time is limited by the spontaneous carrier lifetime. It is, therefore, advantageous to operate the modulator at a high current level and hence higher carrier density and shorter carrier lifetime. When the number of levels is increased, the levels corresponding to low modulator currents will have a longer switching time.

It will also be appreciated that when the laser section of the coupled cavity laser is operated cw, the analog inputs signal is sampled continuously. However, pulsing the laser section ON and OFF enables the analog input signal to be digitized at desired times.

What is claimed is:

1. An analog-to-digital converter comprising a laser, said laser having at least one electrode for receiving an input voltage, and emitting radiation at a frequency determined by said input voltage to said laser;
   an array of photodetectors; and
   wavelength dispersive means directing said radiation from said laser to said array photodetectors, each photodetector receiving radiation of one wavelength, said array giving rise to signal outputs representing a digitized signal.

2. An analog-to-ditital converter as recited in claim 1 in which said laser frequency depends upon the drive current to said laser.

3. An analog-to-digital converter as recited in claim 1 in which said frequency tunable laser comprises a coupled cavity laser.

4. An analog-to-digital converter as recited in claim 3, in which said coupled cavity laser comprises a cleaved coupled cavity laser.

5. An analog-to-digital converter as recited in claim 3 further comprising a second frequency tunable laser and a resistance, said resistance being connected between said input voltage and said second laser.

6. An analog-to-digital converter as recited in claim 5 comprising a second photodetector array, said wavelength dispersive means directing radiation from said second laser to said second array, said second array giving rise to signal outputs representing a digitized signal.

7. An analog-to-digital converter as recited in claim 1 in which said wavelength dispersive means comprises a grating.

8. An analog-to-digital converter as recited in claim 7 in which said frequency tunable laser comprises a coupled cavity laser.

9. An analog-to-digital converter as recited in claim 8 in which said coupled cavity laser comprises a cleaved coupled cavity laser.

10. An analog-to-digital converter as recited in claim 9 further comprising a second frequency tunable laser and a resistance, said resistance being connected between said input voltage and said second laser.

11. An analog-to-digital converter as recited in claim 10 comprising a second photodetector array, said wavelength dispersive means directing radiation from said second laser to said second array, said second array giving rise to signal outputs representing a digitized signal.

* * * * *